(12) United States Patent
Lee et al.

(10) Patent No.: US 10,158,096 B2
(45) Date of Patent: Dec. 18, 2018

(54) ORGANIC LIGHT EMITTING DEVICE

(71) Applicant: LG DISPLAY CO., LTD., Seoul (KR)

(72) Inventors: Yeon Keun Lee, Daejeon (KR);
Seongsu Jang, Daejeon (KR); Jin Ha Hwang, Daejeon (KR); Young Eun Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/310,679

(22) PCT Filed: May 15, 2015

(86) PCT No.: PCT/KR2015/004927
§ 371 (c)(1),
(2) Date: Nov. 11, 2016

(87) PCT Pub. No.: WO2015/174797
PCT Pub. Date: Nov. 19, 2015

(65) Prior Publication Data
US 2017/0077438 A1   Mar. 16, 2017

(30) Foreign Application Priority Data

May 15, 2014  (KR) .......................... 10-2014-0058549

(51) Int. Cl.
*H01L 51/52* (2006.01)
*H01L 27/32* (2006.01)

(52) U.S. Cl.
CPC .......... *H01L 51/5212* (2013.01); *H01L 27/32* (2013.01); *H01L 51/52* (2013.01); *H01L 51/5209* (2013.01); *H01L 51/5225* (2013.01); *H01L 51/5228* (2013.01); *H01L 51/5268* (2013.01); *H01L 2251/5392* (2013.01)

(58) Field of Classification Search
CPC ............. H01L 51/5209; H01L 51/5212; H01L 51/5225; H01L 51/5228; H01L 51/504
See application file for complete search history.

(56) References Cited

U.S. PATENT DOCUMENTS

| | | | |
|---|---|---|---|
| 2002/0011783 A1 | 1/2002 | Hosokawa | |
| 2002/0158835 A1 | 10/2002 | Kobayashi et al. | |
| 2004/0178722 A1* | 9/2004 | Cok | H01L 51/5206 313/506 |
| 2006/0180807 A1* | 8/2006 | Bechtel | H01L 51/52 257/40 |
| 2007/0013293 A1* | 1/2007 | Cok | B82Y 20/00 313/504 |
| 2007/0079869 A1* | 4/2007 | Yukinobu | H01G 9/2022 136/263 |
| 2009/0295285 A1 | 12/2009 | Tokunaga et al. | |
| 2011/0180308 A1* | 7/2011 | Nakamura | H01L 51/5268 174/255 |
| 2011/0284913 A1 | 11/2011 | Ibe et al. | |

(Continued)

FOREIGN PATENT DOCUMENTS

| | | | |
|---|---|---|---|
| EP | 2068328 A1 | 10/2009 | |
| JP | 2001-230086 A | 8/2001 | |

(Continued)

*Primary Examiner* — Bryan Junge
(74) *Attorney, Agent, or Firm* — Dentons US LLP

(57) ABSTRACT

Disclosed is an organic light emitting device.

12 Claims, 10 Drawing Sheets

(56) References Cited

U.S. PATENT DOCUMENTS

| | | | |
|---|---|---|---|
| 2012/0267644 A1* | 10/2012 | Cho | H01L 51/504 |
| | | | 257/88 |
| 2012/0286299 A1 | 11/2012 | Lee et al. | |
| 2013/0299791 A1 | 11/2013 | Hirakata et al. | |
| 2013/0306952 A1* | 11/2013 | Yamae | H01L 51/5212 |
| | | | 257/40 |
| 2013/0320322 A1* | 12/2013 | Muto | H01L 51/0021 |
| | | | 257/40 |
| 2014/0051318 A1* | 2/2014 | Cok | G06F 3/044 |
| | | | 445/24 |
| 2014/0224322 A1* | 8/2014 | Takeda | H01L 51/445 |
| | | | 136/256 |
| 2015/0008401 A1* | 1/2015 | Lee | H01L 51/5275 |
| | | | 257/40 |
| 2015/0279909 A1 | 10/2015 | Tsuji et al. | |

FOREIGN PATENT DOCUMENTS

| | | | |
|---|---|---|---|
| JP | 2009-004348 A | 1/2009 | |
| JP | 2012-009420 A | 1/2012 | |
| JP | WO 2013047660 A1 * | 4/2013 | ........... H01L 51/445 |
| JP | 2013-254947 A | 12/2013 | |
| KR | 10-0849314 B1 | 7/2008 | |
| KR | 10-2012-0035027 A | 4/2012 | |
| KR | 10-2012-0079803 A | 7/2012 | |
| KR | 10-2012-00126353 A | 11/2012 | |
| WO | 2011/093120 A1 | 8/2011 | |
| WO | 2014/068970 A1 | 5/2014 | |

\* cited by examiner

ORGANIC LIGHT EMITTING DEVICE

CROSS-REFERENCE TO RELATED APPLICATIONS

This application is a National Stage Entry of International Application No. PCT/KR2015/004927 filed May 15, 2015, and claims the benefit of and priority to Korean Application No. 10-2014-0058549, filed on May 15, 2014, each of which is hereby incorporated by reference in its entirety for all purposes as if fully set forth herein.

BACKGROUND

Field of the Invention

The disclosure relates to an organic light emitting device.

Discussion of the Related Art

An organic light emitting phenomenon denotes a phenomenon where electrical energy is converted into light energy by using an organic material. That is, in a case where an organic material layer is disposed between an anode and a cathode, when a voltage is applied between the anode and the cathode, the anode injects a hole into the organic material layer, and the cathode injects an electron into the organic material layer. The hole and the electron which are injected into the organic material layer are combined to generate an exciton, and when the exciton is shifted to a ground state, light is emitted.

Since an interval between the anode and the cathode is short, an organic light emitting device is easy to have a short circuit defect. Due to a step in a structure of the organic light emitting device and roughness of coating, the anode can directly contact the cathode, or a thickness of an organic layer can be further thinned in a defective region. The defective region provides a low-resistance path which enables a current to flow, and for this reason, a current can hardly flow or cannot at all flow through the organic light emitting device. Consequently, emission efficiency of the organic light emitting device is reduced, or light is not emitted from the organic light emitting device. In a multi-pixel display device, the short circuit defect causes a dead pixel which cannot emit light or emits light having intensity less than average light intensity, causing the degradation in display quality. For lighting or a low resolution, due to the short circuit defect, a large portion in a corresponding region cannot operate. In order to prevent the short circuit defect, organic light emitting devices are conventionally manufactured in a clear chamber. However, the short circuit defect is not effectively removed even in a very clear environment. In a method where the number of short circuit defects is reduced by increasing an interval between the anode and the cathode, a thickness of the organic layer further increases than a thickness which is actually necessary to operate a device. Such a method causes an increase in the manufacturing cost of organic light emitting devices, and cannot fully remove the short circuit defect.

SUMMARY

Accordingly, the disclosure is directed to provide an organic light emitting device that substantially obviates one or more problems due to limitations and disadvantages of the related art.

An aspect of the disclosure is directed to provide an organic light emitting device and a method of manufacturing the same, in which an operation is performed within a normal range when there is a cause of a short circuit defect, namely, when the short circuit defect occurs.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting device including a first electrode, a second electrode provided opposite to the first electrode, a one or more-layered organic material layer including an emission layer provided between the first electrode and the second electrode, and a secondary electrode provided on a top, a bottom, or a side surface of the first electrode and electrically connected to the first electrode, the secondary electrode having a mesh structure.

Each of meshes of the secondary electrode may configure a pixel of the organic light emitting device.

A sheet resistance of the first electrode may be 5,000Ω/□ or more, and a multiplication of the sheet resistance of the first electrode and an area of one the pixel may be 3,200 V $cm^2/A$ or less.

In another aspect of the disclosure, there is provided a display device including the organic light emitting device.

In another aspect of the disclosure, there is provided a lighting device including the organic light emitting device.

It is to be understood that both the foregoing general description and the following detailed description of the disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Hereinafter, exemplary embodiments of the disclosure will be described in detail with reference to the accompanying drawings.

In this disclosure below, when one part (or element, device, etc.) is referred to as being disposed "on" another part (or element, device, etc.), this includes a case where the one part contacts the other part and a case where another part is provided between two parts.

In the disclosure, when it is described that one comprises (or includes or has) some elements, it should be understood that it may comprise (or include or has) only those elements, or it may comprise (or include or have) other elements as well as those elements if there is no specific limitation.

In an embodiment of the disclosure, an organic light emitting device may include a first electrode; a second electrode opposite to the first electrode; a one or more-layered organic material layer including an emission layer provided between the first electrode and the second electrode; and a mesh-structure second electrode provided on a top, a bottom, or a side surface of the first electrode and electrically connected to the first electrode.

Meshes of the secondary electrode may configure pixels of the organic light emitting device, respectively.

Provided may be an organic light emitting device where a sheet resistance of the first electrode may be 5,000Ω/□ or more, and a multiplication of the sheet resistance of the first electrode and an area of one pixel is 3,200 V cm²/A or less.

According to an embodiment of the disclosure, the sheet resistance of the first electrode may be 10,000Ω/□ or more.

In the disclosure, a unit of a sheet resistance may be expressed as Ω/□. However, since □ is merely an expression for expressing the unit of the sheet resistance, the unit of the sheet resistance may be expressed as only Ω in a calculation operation including the sheet resistance, and □ may be excluded from an obtained result.

According to an embodiment of the disclosure, the first electrode may be provided by one continuous unit. In this case, the secondary electrode may be provided on a top or a bottom of the first electrode.

In detail, according to an embodiment of the disclosure, the first electrode may be a single layer having a sheet resistance of 5,000Ω/□ or more. That is, according to an embodiment of the disclosure, the first electrode may not include an additional layer for providing a high resistance.

Figure 1:
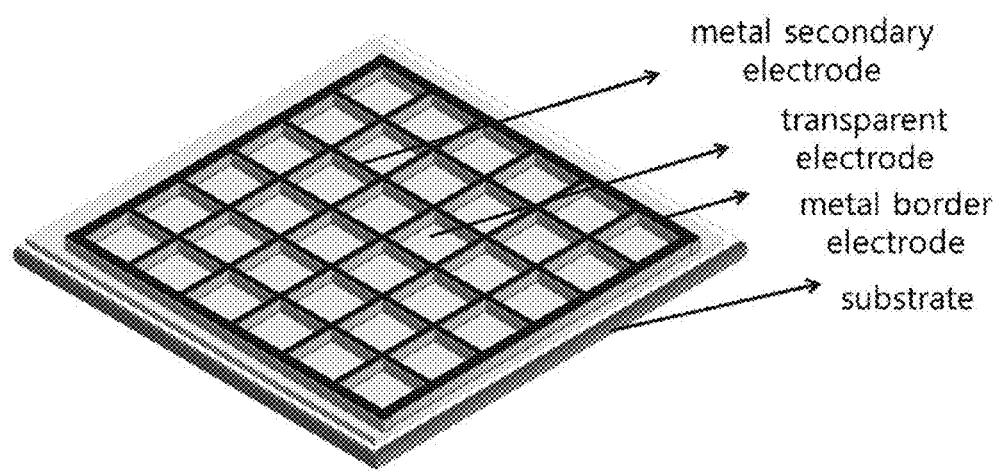
FIG. 1 shows a state where a first electrode and a secondary electrode are provided in an organic light emitting device according to an embodiment of the disclosure.

FIG. 1 shows a state where a first electrode and a secondary electrode are provided in an organic light emitting device according to an embodiment of the disclosure. In detail, it is illustrated that a transparent electrode may be provided as a first electrode on a substrate, and a metal secondary electrode having a mesh structure may be provided on the transparent electrode, and a metal border electrode to which external power is applied is provided in a border area of the metal secondary electrode.

Moreover, according to an embodiment of the disclosure, the first electrode may include two or more conductive units spaced apart from each other. In this case, the secondary electrode may be provided on a top, a bottom, or a side surface of each of the conductive units. In detail, in a case where the first electrode includes the two or more conductive units spaced apart from each other, the secondary electrode may be provided on the side surface of each of the conductive units.

A short circuit defect can occur when the second electrode directly contacts the first electrode. Alternatively, the short circuit defect can occur when a function of an organic material layer is lost due to a thickness reduction or modification of the organic material layer disposed between the first electrode and the second electrode, and for this reason, the first electrode and the second electrode contact each other. When the short circuit defect occurs, a low path is provided for a current of the organic light emitting device, and thus, the organic light emitting device cannot normally operate. The current of the organic light emitting device flows outside a non-defective region due to a leakage current which directly flows from the first electrode to the second electrode due to the short circuit defect. In this case, the emission efficiency of the organic light emitting device is reduced, and in severe cases, since a voltage between the first electrode and the second electrode becomes lower than a threshold voltage of an organic material, the organic light emitting device cannot operate. Also, when a current which distributively flows in the organic material having a wide area concentrates on and flows in a portion where short circuit occurs, high heat occurs locally, and for this reason, there is a risk where a device is broken or fire occurs.

The organic light emitting device according to an embodiment of the disclosure includes the first electrode having a high sheet resistance value, thereby solving a problem where the organic light emitting device is not overall driven due to a current which is all concentrated on a short circuit defect area when the short circuit defect occurs in a pixel of the organic light emitting device.

The inventors have made an effort to discover a factor which enables the organic light emitting device to normally operate despite occurrence of the short circuit defect, and as a result of the discovery, the inventors have discovered that in a case where the organic light emitting device is manufactured to have an increased sheet resistance value of the first electrode, the organic light emitting device normally operates despite occurrence of the short circuit defect.

In detail, the inventors have done the following experiment for obtaining a sheet resistance value of the first electrode for effectively controlling a leakage current caused by a low resistance of a short circuit defect area.

Figure 2:
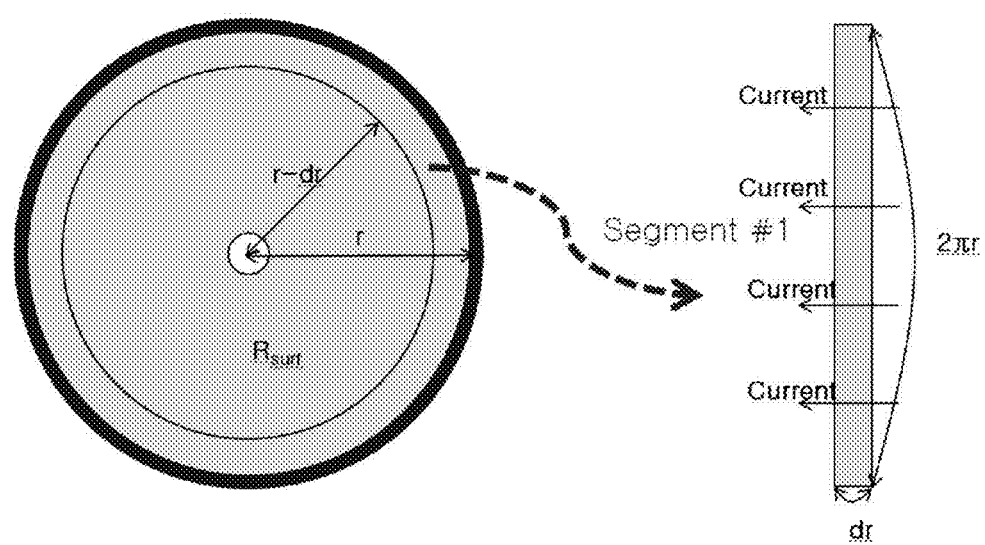
FIG. 2 shows an operation of calculating a resistance value from a metal secondary electrode to a point at which short circuit occurs.

It has been assumed that the metal secondary electrode having a diameter of 2a and a resistance of 0Ω is provided on the first electrode having a sheet resistance "Rsurf-t" to configure a circular pixel, and short circuit having a size equal to a diameter of 2b occurs in a center thereof. Also, since a current in the organic material layer is very low in comparison with a leakage current of a short circuit area, the current in the organic material layer is not considered. In this case, the inventors have calculated a resistance value from the metal secondary electrode to a point at which the short circuit occurs, and an equation for calculating the resistance value is as follows. FIG. 2 shows an operation of calculating a resistance value from the metal secondary electrode to a point at which short circuit occurs.

A resistance when a current flows from a portion having a radius "r" to a portion having a radius "r-dr" is the same as a rectangular resistance value "Rsegment#1" having a width "2π r" and a length "dr" as shown in FIG. 2 when dr is sufficiently small. Therefore, the following equation is obtained by integrating each of segments:

$$R_{(a \to b)} = R_{segment\ \#1} + R_{segment\ \#2} + \ldots + R_{segment\ \#?} =$$

$$\int_b^a R_{surf-t} \times \frac{dr}{2\pi r} = \frac{R_{surf-t}}{2\pi} [\ln r]_b^a$$

Figure 3:
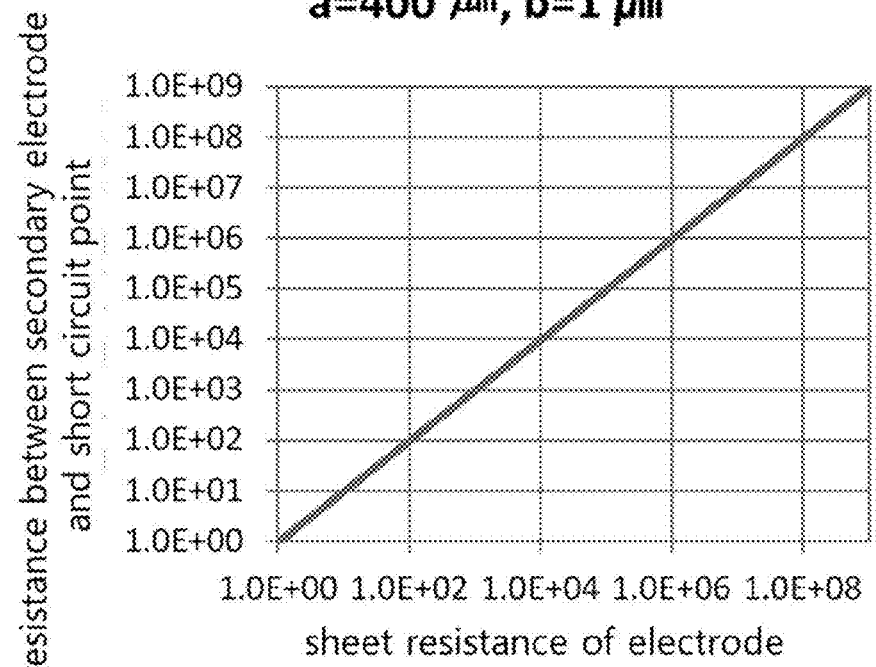
FIG. 3 shows a resistance value from a secondary electrode based on a sheet resistance of a first electrode to a point at which short circuit occurs.

This may denote that a resistance from the secondary electrode to a point of short circuit is largely affected by a size of the point of the short circuit. Also, it may be checked that a sheet resistance of the first electrode is the most important variable among variables of the equation. FIG. 3 shows a resistance value from the secondary electrode based on a sheet resistance of the first electrode to a point at which short circuit occurs. In detail, FIG. 3 shows a resistance value from the secondary electrode to the point of the short circuit based on the sheet resistance of the first electrode when a is 400 μm and b is 1 μm, in a configuration of FIG. 2.

As seen in FIG. 3, it may be checked that the sheet resistance of the first electrode is a variable for controlling a leakage current when short circuit occurs.

According to an embodiment of the disclosure, a size of a point at which short circuit occurs, the sheet resistance value of the first electrode, and an area of a pixel are important variables, and a shape of the pixel does not largely affect a leakage current.

The inventors have done the following experiment for checking that the amount of leakage current caused by the shape of the pixel is not largely changed.

In detail, a voltage applied to the secondary electrode is 8 V, the sheet resistance of the first electrode is 1,000Ω/□, and a diameter of a circular short circuit area is 18.5 μm. Also, when a point at which short circuit occurs is a center of the pixel, a leakage current value in a circular pixel having a diameter of 500 μm is 0.015 A, and a leakage current in a square pixel including a side having a length of 500 μm is 0.0144 A. Through a result of the experiment, it can be seen that a leakage current value based on the shape of the pixel is not largely changed.

Moreover, the inventors have checked that in a square pixel including a side having a length of 500 μm, a voltage applied to the secondary electrode is 8 V, the sheet resistance of the first electrode is 10,000Ω, and a leakage current is effectively controlled when a circular short circuit area having a diameter of 18.5 μm is provided. In detail, when one point where short circuit occurs is positioned at a center, a leakage current has been controlled to 0.0014 A, and when two points where short circuit occurs are positioned at the center, a leakage current has been controlled to 0.0033 A. Also, when a point where short circuit occurs is positioned near the secondary electrode, a leakage current has been controlled to 0.0027 A.

In the organic light emitting device, non-uniformity of luminance is caused by voltage drop (IR drop), an area where a voltage is the largest dropped shows luminance which is lower than that of a normal area, and a whole efficiency of the organic light emitting device is reduced. Furthermore, there is a large risk where an organic material in an area which emits light having relatively high luminance can be further shortened in lifetime than another area. Therefore, it is required to detect an area, where a voltage is the largest dropped, and control voltage drop to a range where an efficiency of the organic light emitting device is reduced.

Therefore, the inventors have done the following experiment for obtaining a variable where non-uniformity of luminance occurs in a whole area of the organic light emitting device.

Figure 14:
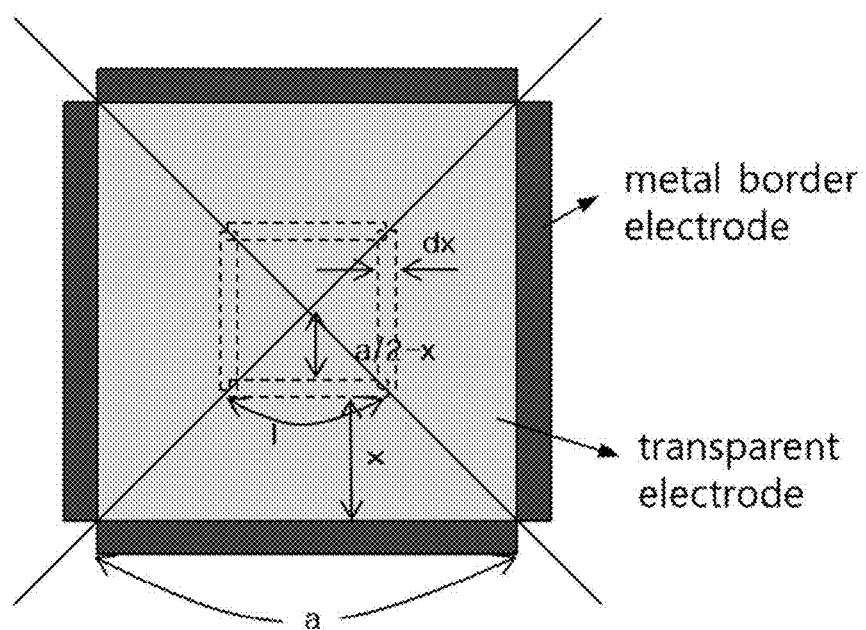
FIG. 14 shows an operation of obtaining an area where the largest voltage drop occurs.

In an organic light emitting device which is on the assumption that a sheet resistance of a cathode is 0 and is sufficiently low, voltage drop (IR drop) in a metal border electrode of the first electrode having a square shape is 0, and the IV characteristic of an organic material layer has a current value which is constant irrespective of a variation of a voltage, when an operating current of the organic light emitting device is Aorg-act and a sheet resistance of a secondary electrode of a first electrode is Rsurf-m, it is assumed that a current input to each of four metal border electrodes is supplied to an organic material layer in a triangular area as in FIG. 14, and an area where a voltage is the largest dropped has been obtained.

FIG. 14 shows an operation of obtaining an area where the largest voltage drop occurs.

In FIG. 14, when the amount of current flowing in each triangle is Aorg-act/4 and a sheet resistance of a secondary electrode is Rsurf-m, voltage drop at an x point has been calculated.

In detail, the amount of current "Ax" flowing at the x point is as follows.

It is assumed that a current flowing from a metal border electrode to a center of a first electrode is output through an organic material layer by a ratio of a whole area to a moved area of the first electrode.

$$A_x = \left( A_{org-act} - A_{org-act} \frac{a^2 - l^2}{a^2} \right) = A_{org-act} \frac{4l^2}{a^2}$$

Moreover, a resistance value in a dx period is as follows.

$$R_{dx} = \frac{R_{surf-m}}{4l} dx \quad l = 2\left(\frac{a}{2} - x\right); \left(a:l = \frac{a}{2}:\frac{a}{2} - x\right)$$

Furthermore, a voltage drop (VIR-drop) value from the metal border electrode to the x point is as follows.

$$V_{IRdrop} = \int_0^x A_{org-act} \times \frac{l^2}{a^2} \times \frac{R_{surf-m}}{4l} dx = \frac{A_{org-act} \times R_{sulf-m}}{2a^2} \times \left[\frac{a}{2}x - \frac{1}{2}x^2\right]_0^x$$

In the equation, an area where voltage is the largest dropped is an x=½ point, which is as follows.

$$\frac{1}{16} \times R_{surf-m} \times A_{org-act}$$

According to an embodiment of the disclosure, a luminance difference in a whole emission area of the organic light emitting device may be within 10%. In detail, when the luminance difference in the whole emission area is 10% or more, the luminance difference can be recognized with eyes, and thus, it is important to manage the luminance difference to within 10%.

When a short circuit defect does not occur, the luminance difference may denote a luminance difference between luminance of one pixel and luminance of another pixel. Also, when the short circuit defect occurs, the luminance difference may denote a luminance difference between luminance of one pixel and luminance of another pixel except a pixel where the short circuit defect occurs.

In detail, according to an embodiment of the disclosure, the luminance difference may be the same meaning as that of a luminance reduction rate, which may be calculated as follows.

Luminance reduction rate=(current of organic material layer per unit area based on IR drop/current of organic material layer per unit area at normal (reference) voltage)×100%

Since luminance of light emitted from the organic material layer is proportional to a current value of the organic material layer, the luminance reduction rate has been calculated as a current value in an organic material.

Figure 15:
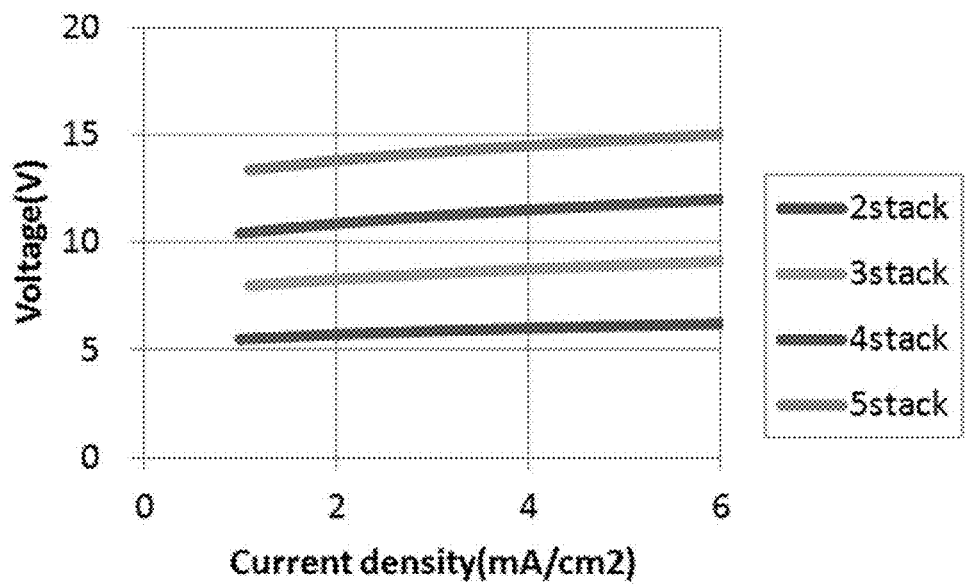
FIG. 15 is a graph showing a result obtained by measuring a current density of each of organic light emitting devices each including two-layered to five-layered emission layers.

FIG. 15 is a graph showing a result obtained by measuring a current density of each of organic light emitting devices each including two-layered to five-layered emission layers.

A luminance reduction rate of an organic light emitting device based on voltage drop has been calculated by using a current density value based on the number of emission layers in FIG. 15.

Figure 16:
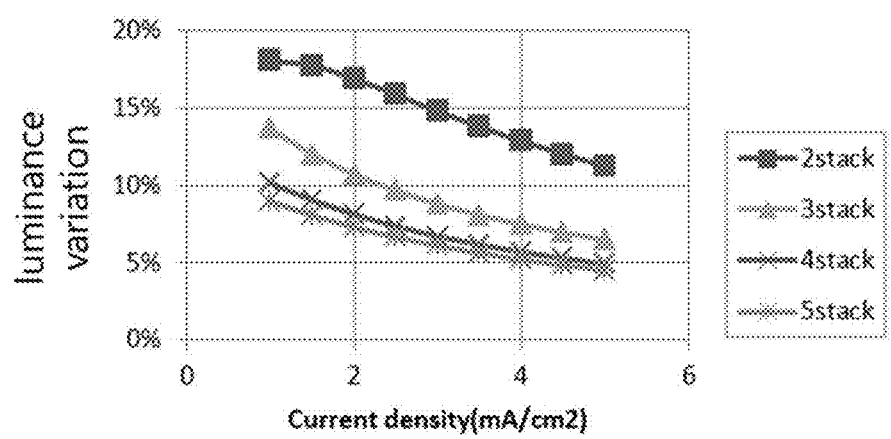
FIGS. 16 and 17 show luminance reduction rates of organic light emitting devices with respect to voltage drop.
Figure 17:
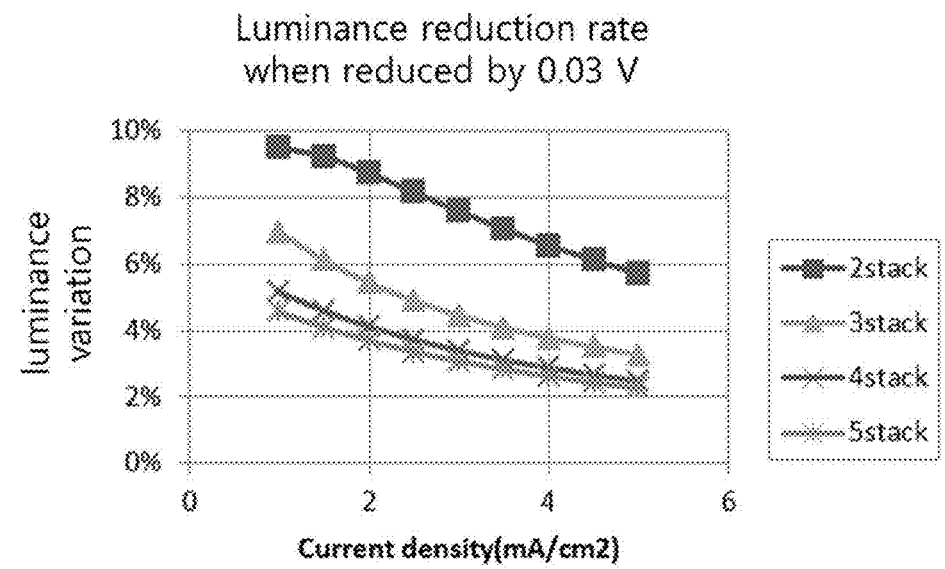

FIGS. 16 and 17 show luminance reduction rates of organic light emitting devices with respect to voltage drop. In detail, in an organic light emitting device including a two-layered emission layer, it can be seen that luminance is reduced by about 10% due to voltage drop of 0.03 V. Also, in an organic light emitting device including a five-layered emission layer, it can be seen that luminance is reduced by about 10% due to voltage drop of 0.06 V.

According to an embodiment of the disclosure, voltage drop should be managed to 0.06 V or less for maintaining a luminance reduction rate of 10% or less in an organic light emitting device caused by the secondary electrode at a current density of 1 mA/cm². In detail, in a case of managing voltage drop to 0.06 V or less, an emission layer may include five or more layers.

In more detail, according to an embodiment of the disclosure, voltage drop should be managed to 0.03 V or less for maintaining a luminance reduction rate of 10% or less in an organic light emitting device caused by the secondary electrode at a current density of 1 mA/cm². In detail, in a case of managing voltage drop to 0.03 V or less, an emission layer may include two or more layers.

A sheet resistance range of the secondary electrode satisfying the conditions may be calculated as expressed in the following equation:

$$A_{org\_act}(A) = \frac{S_{act}(\text{cm}^2) \times J(\text{mA/cm}^2)}{1000(\text{mA}/A)}$$

Furthermore, a sheet resistance range of the secondary electrode for managing voltage drop to 0.03 V or less may be calculated as expressed in the following equation:

$$\frac{1}{16} \times R_{surf\_m}(\Omega/\square) \times A_{org\_act}(A) < 0.03(V)$$

$$\frac{1}{16} \times R_{surf\_m}(\Omega/\square) \times \frac{S_{act}(\text{cm}^2) \times J(\text{mA/cm}^2)}{1000(\text{mA}/A)} < 0.03(V)$$

The equation is summarized as follows. In this case, a current density is assumed as 1 mA/cm².

$$R_{surf\_m}(\Omega/\square) \times S_{act}(\text{cm}^2) < 480(V\text{cm}^2/A)$$

Moreover, a sheet resistance range of the secondary electrode for managing voltage drop to 0.06 V may be calculated as expressed in the following equation:

$$\frac{1}{16} \times R_{surf\_m}(\Omega/\square) \times A_{org\_act}(A) < 0.06(V)$$

$$\frac{1}{16} \times R_{surf\_m}(\Omega/\square) \times \frac{S_{act}(\text{cm}^2) \times J(\text{mA/cm}^2)}{1000(\text{mA}/A)} < 0.06(V)$$

The equation is summarized as follows. In this case, a current density is assumed as 1 mA/cm².

$$R_{surf\_m}(\Omega/\square) \times S_{act}(\text{cm}^2) < 960(V\text{cm}^2/A)$$

Herein, Aorg_act denotes an operating current (A) of the organic light emitting device, Aorg_cell denotes an operating current (A) of an organic material layer in one pixel, Rsurf_t denotes a sheet resistance ($\Omega/\square$) of the first electrode, Rsurf_m denotes a sheet resistance ($\Omega/\square$) of the secondary electrode, Sact denotes a whole emissive area (cm²) of the organic light emitting device, Scell denotes an area (cm²) of one pixel, and J denotes an operating current density (mA/cm²) of the organic light emitting device.

The inventors have discovered that when a size of a pixel of the organic light emitting device is sufficiently small, non-uniformity of luminance in the first electrode provided in the pixel cannot be recognized with eyes. Therefore, the inventors have discovered that in an upper limit value of a sheet resistance required by the first electrode, an efficiency reduction level is more important than luminance uniformity.

Therefore, the inventors have performed a simulation for calculating an upper limit value of the sheet resistance of the first electrode.

An area of the first electrode has been adjusted to 840× 840 µm², and an organic light emitting device including a five-layered emission layer has been applied to the simulation. The inventors have calculated position-based voltage drop (IR drop) and efficiency reduction in the first electrode when a current of 1 mA/cm² is applied to the organic light emitting device.

A simulation method is as follows. On the assumption that a first electrode area of the organic light emitting device is divided into 5×5 virtual pixels and a border area outside the 5×5 virtual pixels has an equivalent potential due to the secondary electrode, the inventors have determined a current, which flows in a direction toward the organic material layer according to a voltage value generated in each of pixels, at a first stage after an arbitrary voltage value is applied to the secondary electrode, and have calculated voltage drop (IR drop), which occurs in each of the virtual pixels of the first electrode due to the flow of the current, by using the sheet resistance value of the first electrode at a second stage. Results of the first stage and the second stage do not affect therebetween, and thus, the inventors have repeated each of the stages a sufficient plurality of times until reaching an equilibrium state. A value of a current which flows in a direction toward the organic material layer according to a voltage value (a voltage applied to the secondary electrode-voltage drop (IR drop) in a corresponding pixel) generated in each pixel has been determined by using JV data obtained by measuring a five-stacked device which is actually manufactured and is shown in FIG. 15. Through the simulation, the inventors have obtained an operating voltage necessary for operating a device with the same operating current according to a variation of the sheet resistance value of the first electrode and position-based voltage drop (IR drop) of the first electrode at that time, and have calculated a luminance reduction rate based on IR drop data. A difference between a maximum value and a minimum value of IR drop values of the 5×5 virtual pixels calculated through the simulation is listed in a maximum voltage difference in the first electrode in the following Table 1. Uniformity uses "1−(Amax−Amin)/(Amax+Amin)" when a maximum current value of each of the virtual pixels is Amax and a minimum current value is Amin. In the simulation, "luminance reduction rate" is calculated as "1−(Amin/Amax)".

Moreover, a maximum voltage difference (V) of the first electrode calculated through the above-described equations is listed in the following Table 1.

A largest difference between a result of the simulation and a result of the equation is whether a current density of the organic material layer is reflected based on a variation of a voltage. In this context, the inventors have performed the simulation for predicting a result by minimizing occurrence of an error. Different current values of the organic material layers in the respective pixels have been applied to the simulation. Table 1 shows a result obtained by reflecting a variation of a current density of an organic material caused by voltage drop in the first electrode, and through Table 1, an increase level of an operating voltage of a device can be predicted.

As a result of measurement performed identically to the simulation, when the sheet resistance of the first electrode is 10 kΩ/□ or less, a value approximately equal to 10 kΩ/□ has been measured.

In Table 1, when the sheet resistance is low, a voltage of about 13.3 V should be applied to the secondary electrode in order for a current of 1 mA/cm² to flow in the first electrode, but when the sheet resistance is 1 MΩ/□, a voltage of about 13.6 V should be applied to the secondary electrode. That is, since a voltage which is about 2% higher is necessary for having the same current, it can be seen that energy efficiency is reduced about 2% further in a case, where the sheet resistance is 1 MΩ/□, than a case where the sheet resistance is 10 kΩ/□. On the other hand, it can be seen that a luminance reduction rate is about 40%, and a change in luminance uniformity caused by luminance reduction occurs to a higher degree.

When a luminance difference of 30% or more occurs in the organic light emitting device, a significant lifetime difference occurs between a bright area and a dark area and can affect a lifetime of the organic light emitting device itself.

By using a graph showing a result obtained by measuring a current density of each of the organic light emitting devices each including the two-layered to five-layered emission layers, a luminance reduction rate which occurs in each of a voltage difference of 0.1 V and a voltage difference of 0.2 V can be checked.

Figure 18:
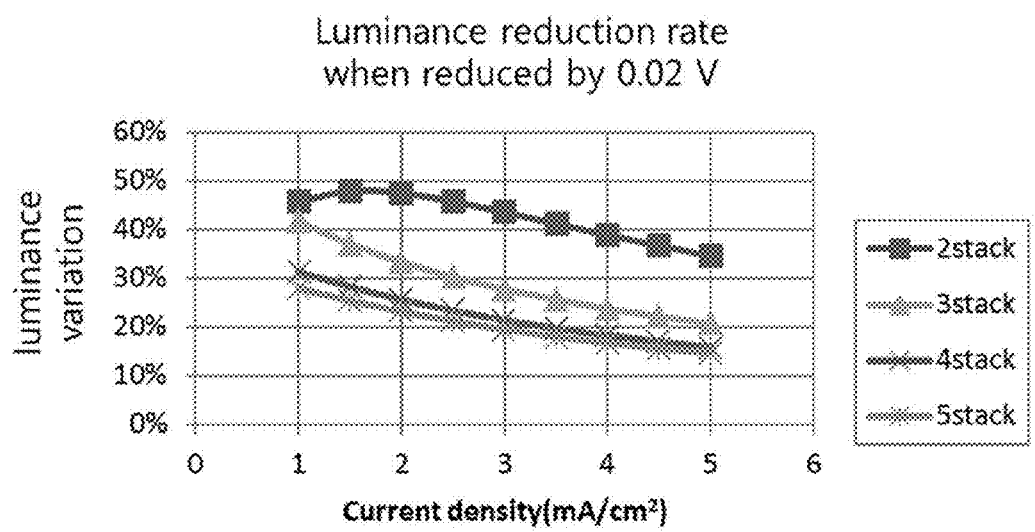
FIG. 18 shows a luminance reduction rate of an organic light emitting device when a voltage is dropped by 0.1 V.

FIG. 18 shows a luminance reduction rate of an organic light emitting device when a voltage is dropped by 0.1 V.

Figure 19:
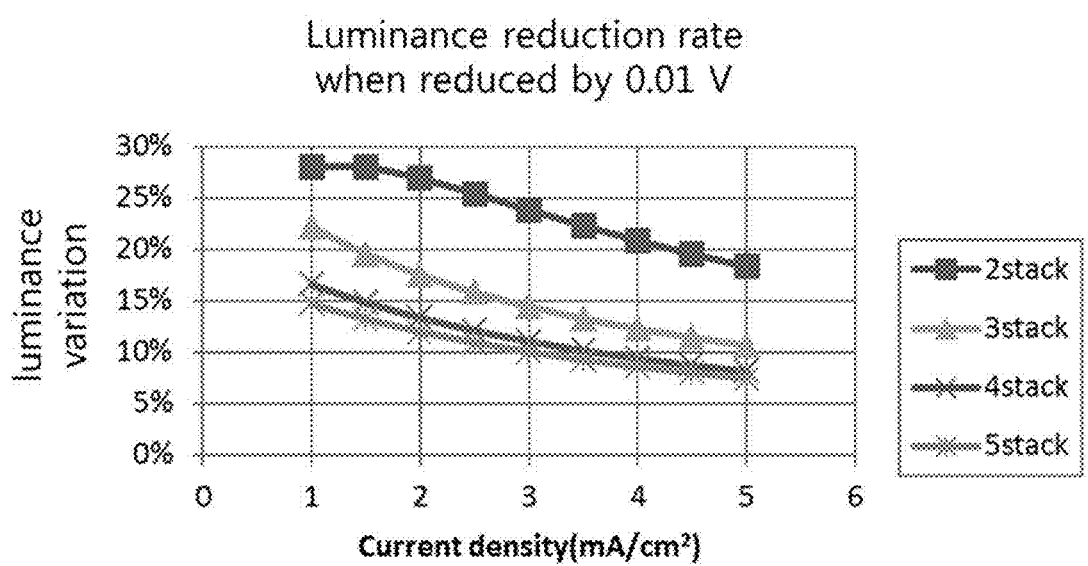
FIG. 19 shows a luminance reduction rate of an organic light emitting device when a voltage is dropped by 0.2 V.

FIG. 19 shows a luminance reduction rate of an organic light emitting device when a voltage is dropped by 0.2 V.

As seen in FIGS. 18 and 19, in an organic light emitting device including a five-layered emission layer, it can be checked that when a voltage is dropped by 0.2 V, luminance is reduced by about 30%. Also, in an organic light emitting device including a two-layered emission layer, it can be checked that when a voltage is dropped by 0.1 V, luminance is reduced by about 30%.

An upper limit value of a sheet resistance value of the first electrode for managing voltage drop to 0.1 V in each pixel may be calculated as expressed in the following equation:

TABLE 1

| | Simulation result | | | | | Result based on calculation method described above |
|---|---|---|---|---|---|---|
| Sheet resistance of first electrode (Ω/□) | Operating voltage (V) | Maximum voltage difference in first electrode (V) | Efficiency reduction | Luminance uniformity | Luminance reduction rate | Maximum voltage difference in first electrode (V) |
| 10,000 | 13.3 | 0.004 | 0.1% | 99.7% | 0.6% | 0.004 |
| 50,000 | 13.3 | 0.021 | 0.2% | 98.4% | 3.1% | 0.022 |
| 100,000 | 13.4 | 0.041 | 0.3% | 96.9% | 6.0% | 0.044 |
| 300,000 | 13.4 | 0.117 | 0.7% | 91.2% | 16.2% | 0.131 |
| 500,000 | 13.5 | 0.180 | 1.1% | 86.1% | 24.4% | 0.219 |
| 1,000,000 | 13.6 | 0.320 | 2.0% | 75.4% | 39.5% | 0.438 |

$$\frac{1}{16} \times R_{surf\_t}(\Omega/\square) \times A_{org\_cell}(A) < 0.1(V)$$

$$\frac{1}{16} \times R_{surf\_t}(\Omega/\square) \times \frac{S_{cell}(cm^2) \times J(mA/cm^2)}{1000(mA/A)} < 0.1(V)$$

The equation is summarized as follows. In this case, a current density is assumed as 1 mA/cm².

$$R_{surf\_t}(\Omega/\square) \times S_{cell}(cm^2) < 1,600(Vcm^2/A)$$

The upper limit value of the sheet resistance value of the first electrode for managing voltage drop to 0.2 V in each pixel may be calculated as expressed in the following equation:

$$\frac{1}{16} \times R_{surf\_t}(\Omega/\square) \times A_{org\_cell}(A) < 0.2(V)$$

$$\frac{1}{16} \times R_{surf\_t}(\Omega/\square) \times \frac{S_{cell}(cm^2) \times J(mA/cm^2)}{1000(mA/A)} < 0.2(V)$$

The equation is summarized as follows. In this case, a current density is assumed as 1 mA/cm².

$$R_{surf\_t}(\Omega/\square) \times S_{cell}(cm^2) < 3,200(Vcm^2/A)$$

According to an embodiment of the disclosure, when a current density is 1 mA/cm², a multiplication of the sheet resistance of the secondary electrode and a whole pixel area of the organic light emitting device may be 960 V cm²/A or less.

According to an embodiment of the disclosure, the sheet resistance of the secondary electrode may be 3Ω/□ or less.

According to an embodiment of the disclosure, an aperture ratio of the secondary electrode may be 70% or more.

According to an embodiment of the disclosure, an area of the pixel may be 0.01 mm² to 0.64 cm².

According to an embodiment of the disclosure, the number of the pixels may be 1,000 to 1,000,000.

According to an embodiment of the disclosure, the first electrode may be a transparent electrode. In detail, according to an embodiment of the disclosure, the first electrode may include one or more materials selected from the group consisting of Nb-based oxide, Ti-based oxide, Zn-based oxide, and a conductive polymer.

According to an embodiment of the disclosure, the Nb-based oxide may be NbOx.

According to an embodiment of the disclosure, the Ti-based oxide may be TiOx.

According to an embodiment of the disclosure, the Zn-based oxide may be GAZO(Ga1-xZnxO), AZO(Al1-xZnxO), or GZO(Ga-doped ZnO).

According to an embodiment of the disclosure, the conductive polymer may be poly(3-methylthiophene), poly[3,4-(ethylene-1,2-dioxy)thiophene], polypyrrole, or polyaniline.

According to an embodiment of the disclosure, the emission layer may include one to ten emission layers. In detail, according to an embodiment of the disclosure, the emission layer may include two to six emission layers.

According to an embodiment of the disclosure, the organic light emitting device may further include an insulation layer provided between the secondary electrode and the organic material layer, and a diameter of the insulation layer may be 10 μm or more greater than a line width of the secondary electrode.

In detail, when an area where short circuit occurs is very adjacent to the secondary electrode or is disposed on the secondary electrode, the area where the short circuit occurs can be enlarged to a wide area. Therefore, a width of the insulation layer may be adjusted 10 μm or more greater than the line width of the secondary electrode so that the area where the short circuit occurs is not excessively adjacent to the secondary electrode.

According to an embodiment of the disclosure, a luminance difference between one pixel and another pixel may be within 30%.

The luminance difference may denote a luminance difference between one pixel and another pixel when a short circuit defect does not occur. Also, the luminance difference may denote a luminance difference between one pixel and another pixel except a pixel having a short circuit defect when the short circuit defect occurs.

According to an embodiment of the disclosure, the sheet resistance of the first electrode may be 5,000Ω/□ or more, a multiplication of the sheet resistance of the first electrode and an area of one pixel may be 3,200 V cm²/A or less, and a multiplication of the sheet resistance of the secondary electrode and a whole pixel area of the organic light emitting device may be 960 V cm²/A or less.

According to an embodiment of the disclosure, the sheet resistance of the first electrode may be 5,000Ω/□ or more, a multiplication of the sheet resistance of the first electrode and an area of one pixel may be 1,600 V cm²/A or less, and a multiplication of the sheet resistance of the secondary electrode and a whole pixel area of the organic light emitting device may be 480 V cm²/A or less.

According to an embodiment of the disclosure, the sheet resistance of the first electrode may be 10,000Ω/□ or more, a multiplication of the sheet resistance of the first electrode and an area of one pixel may be 3,200 V cm²/A or less, and a multiplication of the sheet resistance of the secondary electrode and a whole pixel area of the organic light emitting device may be 480 V cm²/A or less.

According to an embodiment of the disclosure, a resistance between a first electrode included in one pixel and a first electrode included in another pixel may be 2,000Ω to 800,000Ω.

According to an embodiment of the disclosure, each of the pixels may emit white light of 2,000 K to 12,000 K.

According to an embodiment of the disclosure, the secondary electrode may be formed of a metal material. That is, the secondary electrode may be a metal electrode.

The secondary electrode may generally use all metals. In detail, the secondary electrode may include aluminum (Al), copper (Cu), and/or silver (Ag) which are/is good in conductivity. In a case of using aluminum for an adhesive force to a transparent electrode and stability in a photo process, the secondary electrode may use a molybdenum (Mo)/Al/Mo layer.

According to an embodiment of the disclosure, the organic material layer may include one or more emission layers and may further include one or more layers selected from the group consisting of a hole injecting layer, a hole transporting, a hole blocking layer, a charge generating layer, an electron blocking layer, an electron transporting layer, and an electron injecting layer.

The charge generating layer denotes a layer which generates a hole and an electron when a voltage is applied thereto.

The substrate may use a substrate which is good in transparency, surface smoothness, manageability, and waterproofness. In detail, the substrate may use a glass substrate, a thin film glass substrate, or a transparent plastic substrate. The plastic substrate may include a single layer a multi-layer including films such as polyethylene terephthalate (PET), polyethylene naphthalate (PEN), polyether ether ketone (PEEK), and polyimide (PI). Also, the substrate itself may include a light scattering function. However, the substrate is not limited thereto and may use a substrate which is conventionally applied to organic light emitting device.

According to an embodiment of the disclosure, the first electrode may be an anode, and the second electrode may be a cathode. Also, the first electrode may be the cathode, and the second electrode may be the anode.

The anode may use a material which is large in work function, in order for a hole to be smoothly injected into the organic material layer. Examples of a material of the anode available herein may include metals such as vanadium, chromium, copper, zinc, and gold, or an alloy thereof; metal oxide such as zinc oxide, indium oxide, indium zinc oxide (ITO), and indium zinc oxide (IZO); a combination of oxide and metal such as $ZnO:Al$ or $SnO_2:Sb$; and conductive polymers such as poly(3-methylthiophene), poly[3,4-(ethylene-1,2-dioxy)thiophene], polypyrrole, and polyaniline, but are not limited thereto.

The cathode may use a material which is small in work function, in order for an electron to be easily injected into the organic material layer. Examples of a material of the cathode may include metals such as magnesium (Mg), calcium (Ca), sodium (Na), kalium (K), titanium (Ti), indium (In), yttrium (Y), lithium (Li), gadolinium (Gd), aluminum (Al), silver (Ag), tin (Sn), and plumbum (Pb), or an alloy thereof; and a material, having a multi-layer structure, such as LiF/Al or $LiO_2$/Al, but are not limited thereto.

A material of the cathode is not limited to only the cathode and may be used as a material of the anode.

A material of the hole transporting layer according to an embodiment of the disclosure is a material which receives a hole from the anode or the hole injecting layer and transports the hole to an emission layer, and a material which is high in mobility of holes is suitable for the material of the hole transporting layer. Detailed examples of the material of the hole transporting layer may include an arylamine-based organic material, a conductive polymer, and a block copolymer including conjugation and non-conjugation, but are not limited thereto.

A material of the emission layer according to an embodiment of the disclosure is a material which combines a hole and an electron, respectively supplied from the hole transporting layer and the electron transporting layer, to emit visible light and may be a material which is good in quantum efficiency for fluorescence or phosphorescence. Detailed examples of the material of the emission layer may include 8-hydroxyquinoline aluminum complex (Alq3); carbazole-based compounds; dimerized styryl compounds; BAlq; BAlq; 10-hydroxybenzo quinoline-metal compounds; benzoxazole, benzthiazole and benzimidazole series of compounds; poly (p-phenylene vinylene) (PPV) series polymer; Spiro compounds; polyfluorene; and rubrene, but are not limited thereto.

A material of the electron transporting layer according to an embodiment of the disclosure is a material which transports an electron, injected from the cathode, to the emission layer, and a material which is high in mobility of electrons is suitable for the material of the electron transporting layer. Detailed examples of the material of the electron transporting layer may include 8-hydroxyquinoline aluminum complex; complex including Alq3; organic radical compounds; hydroxyflavone-metal complex, but are not limited thereto.

According to an embodiment of the disclosure, the secondary electrode may be located in a non-emissive area of the organic light emitting device.

According to an embodiment of the disclosure, the organic light emitting device may further include an insulation layer provided in the non-emissive area.

According to an embodiment of the disclosure, the insulation layer may insulate the secondary electrode from the organic material layer.

According to an embodiment of the disclosure, the organic light emitting device may be sealed by an encapsulation layer.

The encapsulation layer may be formed of a transparent resin layer. The encapsulation layer protects the organic light emitting device from oxygen and pollutants and may be formed of a transparent material so as not to obstruct emission of light from the organic light emitting device. Transparency may denote that light is transmitted by 60% or more. In detail, the transparency may denote that the light is transmitted by 75% or more.

According to an embodiment of the disclosure, the organic light emitting device may include a light scattering layer. In detail, according to an embodiment of the disclosure, the organic light emitting device may further include a substrate on a surface opposite to a surface on which the organic material layer of the first electrode is provided, and moreover, may further include the light scattering layer provided between the substrate and the first electrode. According to an embodiment of the disclosure, the light scattering layer may include a planarization layer. According to an embodiment of the disclosure, the planarization layer may be provided between the first electrode and the light scattering layer.

Alternatively, according to an embodiment of the disclosure, the organic light emitting device may further include a substrate on a surface opposite to a surface on which the organic material layer of the first electrode is provided, and moreover, may further include the light scattering layer on a surface opposite to a surface on which the first electrode of the substrate is provided.

According to an embodiment of the disclosure, the light scattering layer may use a structure, which induces scattering of light to enhance the light extraction efficiency of the organic light emitting device, without a special limitation. In detail, according to an embodiment of the disclosure, the light scattering layer may use a structure where scattering particles are dispersed in a binder, a film having a concave-convex pattern, and/or a film having hazeness.

According to an embodiment of the disclosure, the light scattering layer may be directly formed on the substrate by a process such as spin coating, bar coating, or slit coating. Alternatively, the light scattering layer may be manufactured in a film type and may be attached on the substrate.

According to an embodiment of the disclosure, the organic light emitting device may be a flexible organic light emitting device. In this case, the substrate may include a flexible material. In detail, the substrate may be a thin film type glass, a plastic substrate, or a film type substrate which is bendable.

A material of the plastic substrate is not specially limited, but generally, the plastic substrate may include a single layer a multi-layer including films such as polyethylene terephthalate (PET), polyethylene naphthalate (PEN), polyether ether ketone (PEEK), and polyimide (PI).

In the disclosure, a display device including the organic light emitting device is provided. In the display device, the organic light emitting device may act as a pixel or a backlight. In addition, elements well known to those skilled in the art may be applied to the display device.

In the disclosure, a lighting device including the organic light emitting device is provided. In the lighting device, the organic light emitting device may act as an emission part. In addition, elements well known to those skilled in the art may be applied to the lighting device.

Hereinafter, exemplary embodiments of the disclosure will now be described in detail. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Embodiment 1-1

An organic light emitting device which includes an emissive area "90 mm×90 mm" and three emission layers has been manufactured. In detail, Al is deposited by 400 µm on a transparent substrate, and a secondary electrode which has a line width of 40 µm and a pitch of 840 µm is formed through a photoresist process. In this case, a sheet resistance value of the secondary electrode is about 1±0.5Ω/□. Subsequently, a first electrode is formed of gallium and aluminum codoped zinc oxide (GAZO) to have a thickness of 100 nm and is baked for one hour at a temperature of 250° C. In this case, the sheet resistance of the first electrode is 5.0E+03Ω/□. An insulation layer having a line width of 50 µm is formed in the same pattern on the secondary electrode, thereby allowing an organic material layer not to emit light on the secondary electrode.

Furthermore, an organic material layer including a three-layered emission layer is formed, and a second electrode is formed of Al, thereby manufacturing an organic light emitting device.

Figure 4:
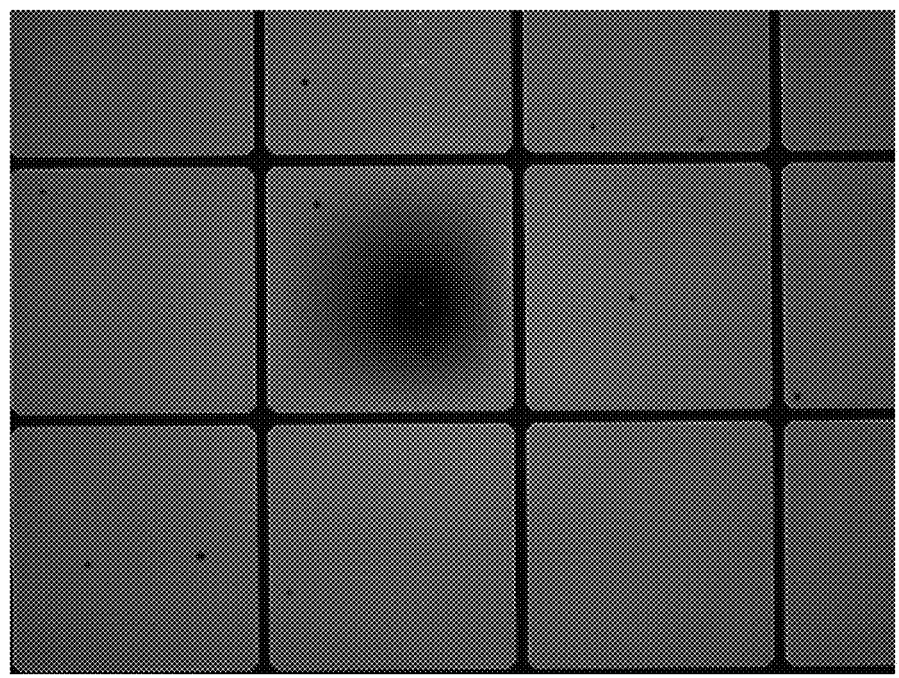
FIG. 4 shows an image of an organic light emitting device manufactured according to an embodiment 1-1 after short circuit occurs.

Furthermore, in order to check a normal operation of the organic light emitting device when short circuit occurs, occurrence of the short circuit is induced by manually applying local pressure FIG. 4 shows an image of an organic light emitting device manufactured according to an embodiment 1-1 after short circuit occurs.

Figure 5:
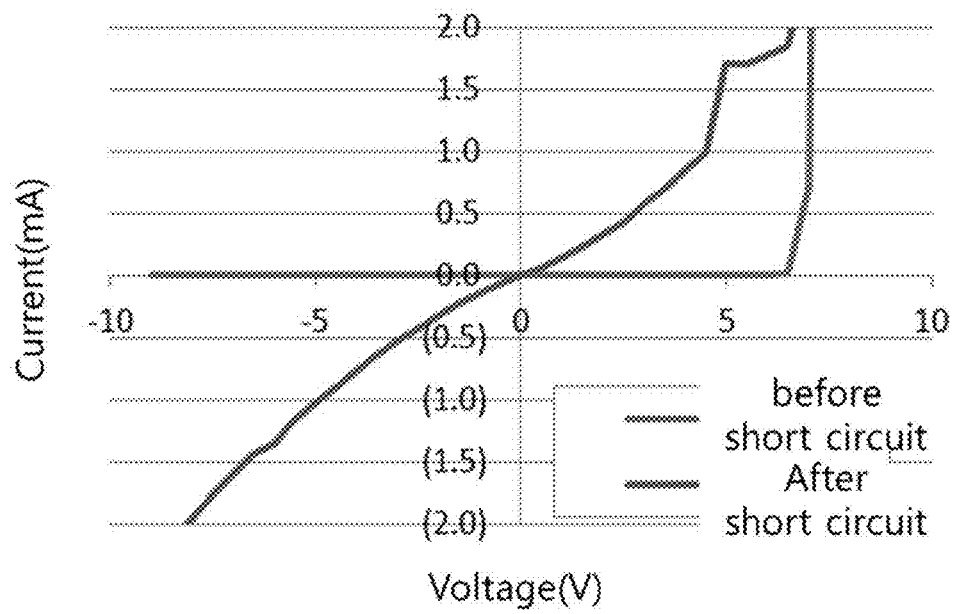
FIG. 5 shows a result of IV sweep performed before and after short circuit occurs in the organic light emitting device manufactured according to the embodiment 1-1.

FIG. 5 shows a result of IV sweep performed before and after short circuit occurs in the organic light emitting device manufactured according to the embodiment 1-1.

Embodiment 1-2

Except that a sheet resistance of a first electrode is adjusted to 2.0E+04Ω/□, an organic light emitting device is manufactured in the same method as the embodiment 1-1.

Figure 6:
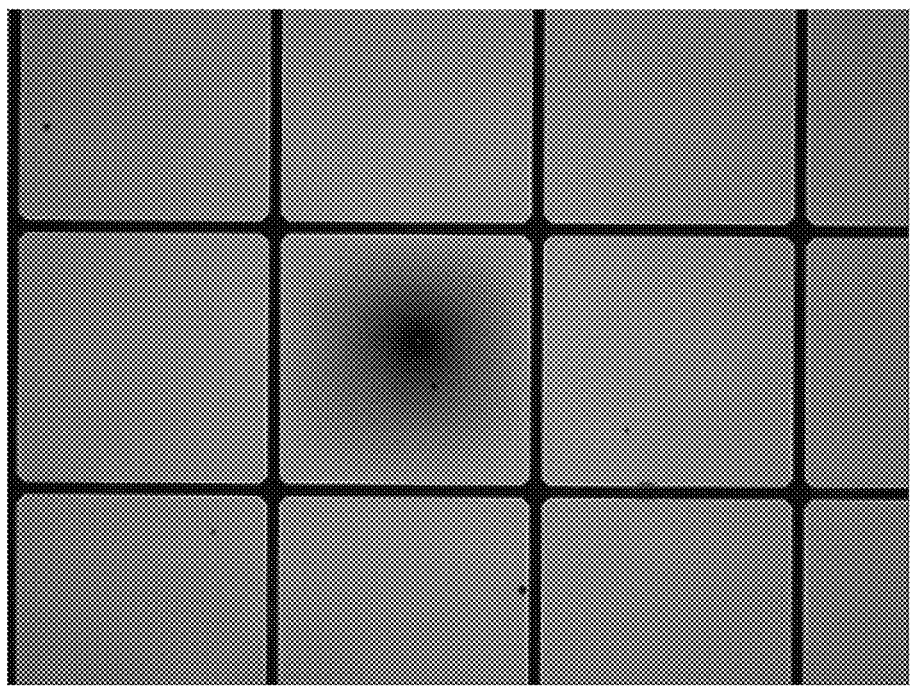
FIG. 6 shows an image of an organic light emitting device manufactured according to an embodiment 1-2 after short circuit occurs.

FIG. 6 shows an image of an organic light emitting device manufactured according to an embodiment 1-2 after short circuit occurs.

Figure 7:
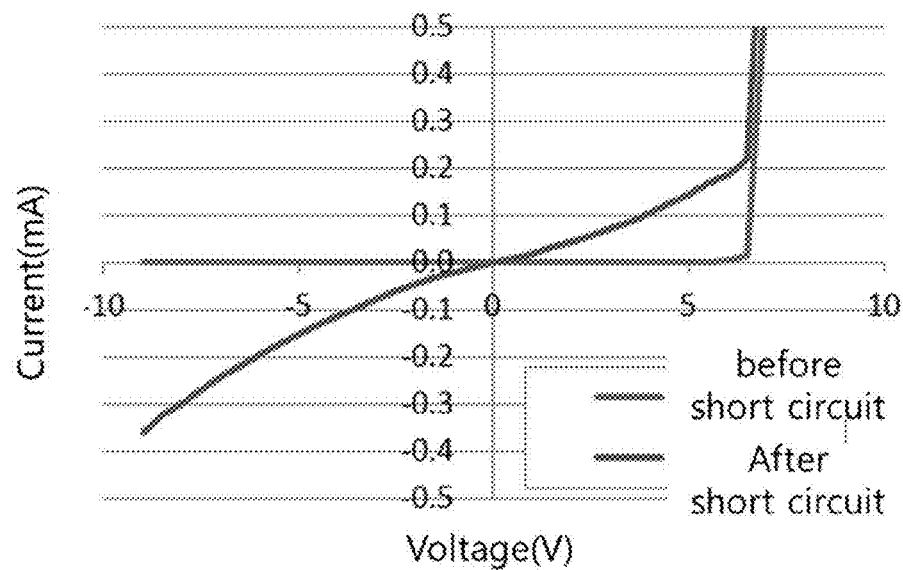
FIG. 7 shows a result of IV sweep performed before and after short circuit occurs in the organic light emitting device manufactured according to the embodiment 1-2.

FIG. 7 shows a result of IV sweep performed before and after short circuit occurs in the organic light emitting device manufactured according to the embodiment 1-2.

Embodiment 1-3

Except that a sheet resistance of a first electrode is adjusted to 2.3E+04Ω/□, an organic light emitting device is manufactured in the same method as the embodiment 1-1.

Figure 8:
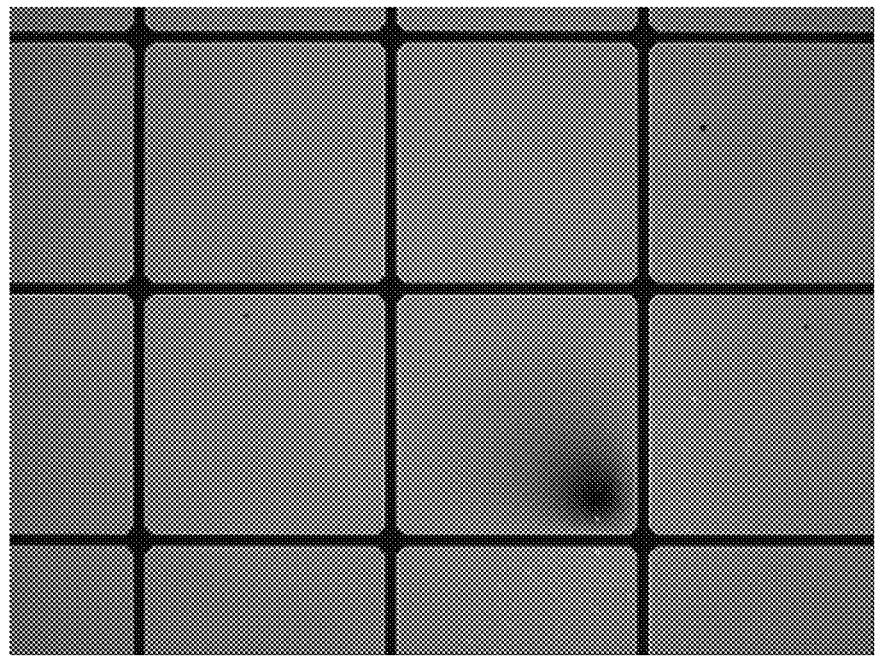
FIG. 8 shows an image of an organic light emitting device manufactured according to an embodiment 1-3 after short circuit occurs.

FIG. 8 shows an image of an organic light emitting device manufactured according to an embodiment 1-3 after short circuit occurs.

Figure 9:
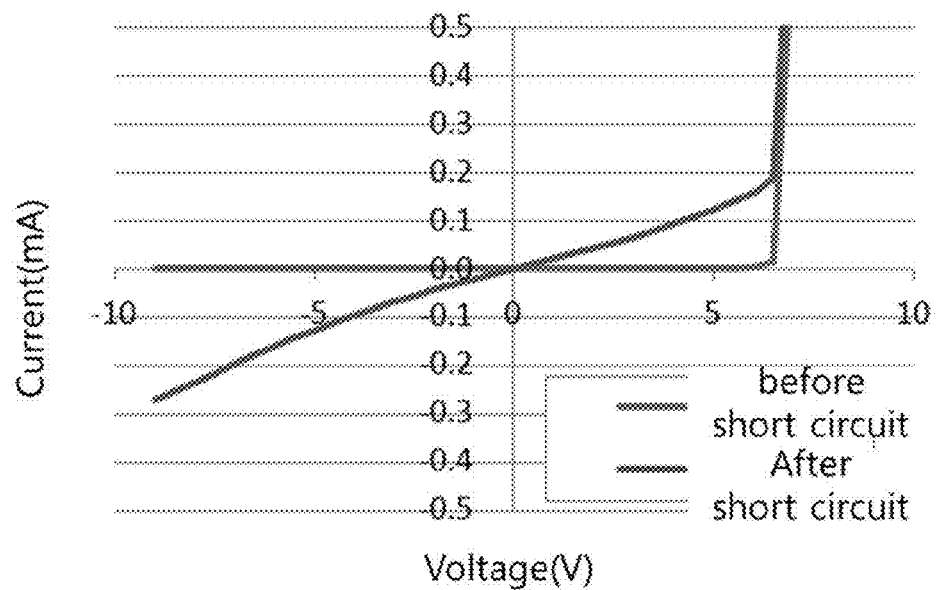
FIG. 9 shows a result of IV sweep performed before and after short circuit occurs in the organic light emitting device manufactured according to the embodiment 1-3.

FIG. 9 shows a result of IV sweep performed before and after short circuit occurs in the organic light emitting device manufactured according to the embodiment 1-3.

Embodiment 1-4

Except that a sheet resistance of a first electrode is adjusted to 7.0E+04Ω/□, an organic light emitting device is manufactured in the same method as the embodiment 1-1.

Figure 10:
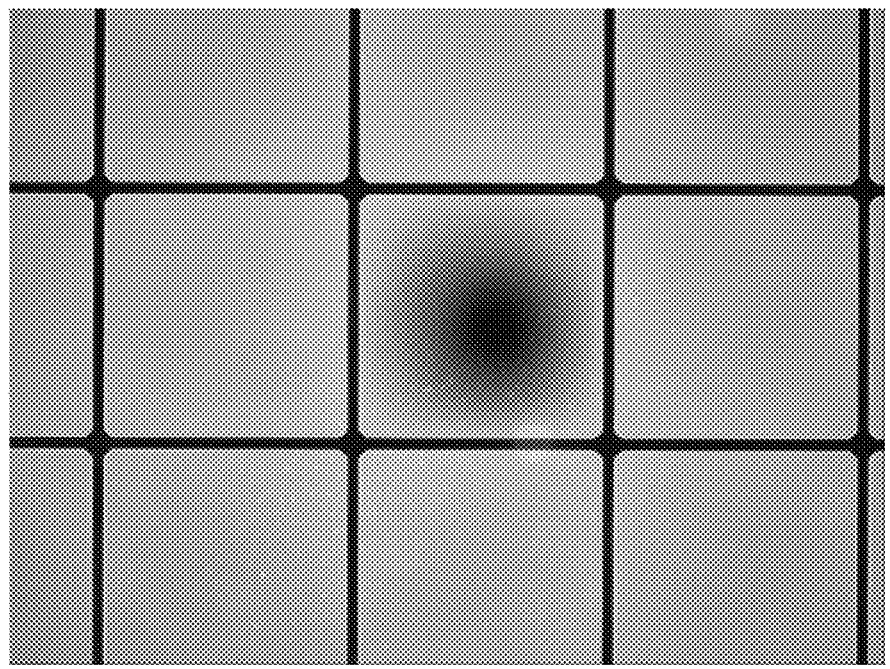
FIG. 10 shows an image of an organic light emitting device manufactured according to an embodiment 1-4 after short circuit occurs.

FIG. 10 shows an image of an organic light emitting device manufactured according to an embodiment 1-4 after short circuit occurs.

Figure 11:
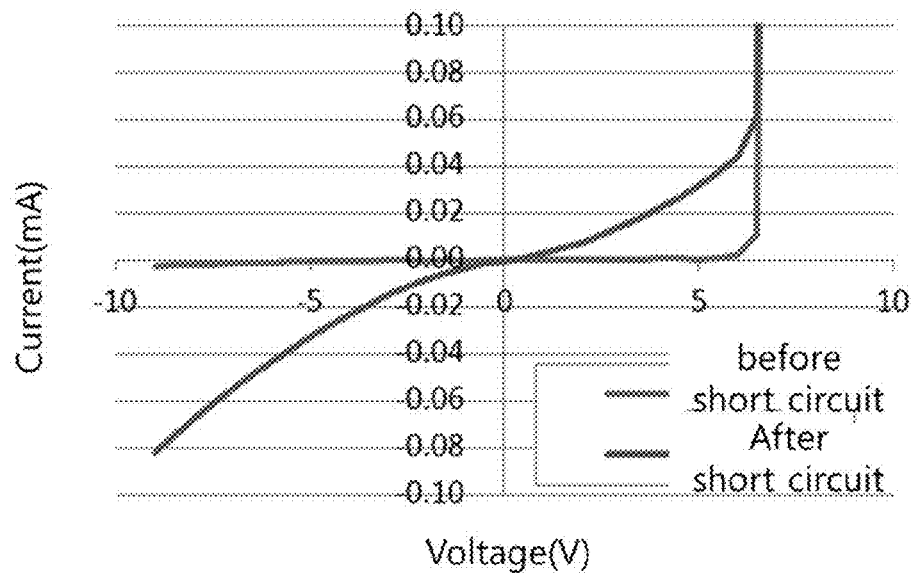
FIG. 11 shows a result of IV sweep performed before and after short circuit occurs in the organic light emitting device manufactured according to the embodiment 1-4.

FIG. 11 shows a result of IV sweep performed before and after short circuit occurs in the organic light emitting device manufactured according to the embodiment 1-4.

Embodiment 1-5

Except that a sheet resistance of a first electrode is adjusted to 1.2E+05Ω/□, an organic light emitting device is manufactured in the same method as the embodiment 1-1.

Figure 12:
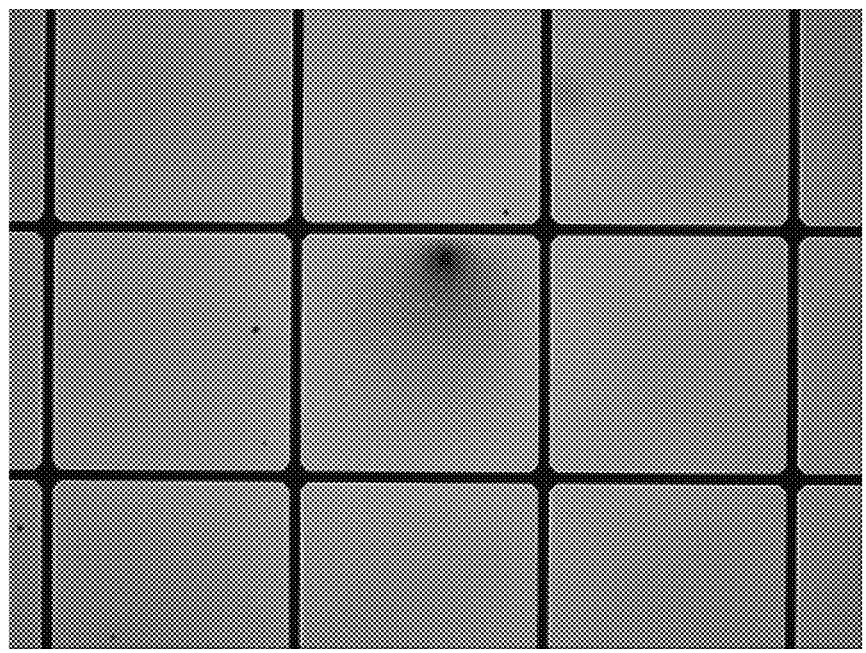
FIG. 12 shows an image of an organic light emitting device manufactured according to an embodiment 1-5 after short circuit occurs.

FIG. 12 shows an image of an organic light emitting device manufactured according to an embodiment 1-5 after short circuit occurs.

Figure 13:
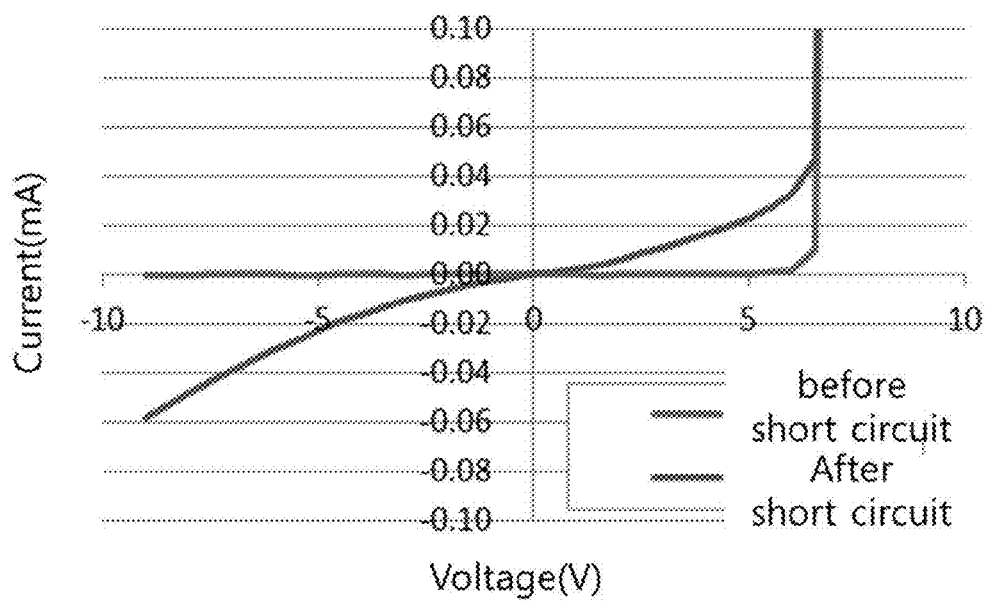
FIG. 13 shows a result of IV sweep performed before and after short circuit occurs in the organic light emitting device manufactured according to the embodiment 1-5.

FIG. 13 shows a result of IV sweep performed before and after short circuit occurs in the organic light emitting device manufactured according to the embodiment 1-5.

COMPARATIVE EXAMPLE 1

Except that a first electrode is formed of indium tin oxide (ITO) having a sheet resistance of 20Ω/□ applied to general organic light emitting devices, an organic light emitting device is manufactured in the same method as the embodiment 1-1.

When short circuit occurs, the organic light emitting device according to the comparative example 1 does not overall operate.

In the organic light emitting devices according to the embodiments 1-1 to 1-5 and the comparative example 1, the inventors have checked the amount of leakage current by applying a reverse voltage of 8.5 V before and after short circuit occurs, and a result of the check is listed in the following Table 2. In measuring the amount of leakage current, the reverse voltage is applied for measuring the amount of leakage current except for a current for emitting light.

TABLE 2

|  | Sheet resistance of first electrode (Ω/□) | −8.5 V Current (mA) before short circuit occurs | −8.5 V Current (mA) after short circuit occurs |
| --- | --- | --- | --- |
| Comparative example 1 | 20 | 3.0E−03 | >100 |
| Embodiment 1-1 | 5.0E+03 | 1.1E−03 | 2.1426 |
| Embodiment 1-2 | 2.0E+04 | 9.0E−04 | 0.3238 |
| Embodiment 1-3 | 2.3E+04 | 1.0E−03 | 0.2547 |
| Embodiment 1-4 | 7.0E+04 | 2.2E−03 | 0.0747 |
| Embodiment 1-5 | 1.2E+05 | 5.0E−04 | 0.0533 |

In the embodiments 1-1 to 1-5, the inventors have checked that the amount of leakage current corresponding to a reverse voltage of an operating voltage before and after short circuit occurs is 2 mA to 0.5 mA and is 1% or less of a normal operating current of 160 mA.

In detail, in the embodiments 1-1 to 1-5, the inventors have checked that when the sheet resistance of the first electrode is 5,000Ω/□ or more, a short circuit prevention function is performed.

Embodiment 2

Except that a sheet resistance value of a first electrode is variously adjusted, the inventors have measured an operating voltage based on a current density of each of organic light emitting devices manufactured by the same method as the embodiment 1-1.

A result of the check is listed in the following Table 3. As seen in the following Table 3, the inventors have checked that similarly to Table 1 showing the above-described simulation result, an increase in the operating voltage caused by an increase in the sheet resistance value of the first electrode is very small.

In detail, according to the simulation result of Table 1, when current densities are the same, energy efficiency is reduced about 2% further in a case, where the sheet resistance of the first electrode is 1 MΩ/□, than a case where the sheet resistance of the first electrode is 10 kΩ/□. Likewise, according to a result of the following Table 3, it can be seen that energy efficiency is reduced about 1% further in a case, where an average of the sheet resistances of the first electrodes is 2.0E+05Ω/□, than a case where an average of the sheet resistances of the first electrodes is 4.7E+03Ω/□. The reduction in the energy efficiency may be calculated based on an increase rate of an operating voltage when the current densities are the same.

TABLE 3

| | Average of sheet resistances of first electrodes (Ω/□) | Operating voltage (V) at 1 mA/cm² | Operating voltage (V) at 2 mA/cm² |
|---|---|---|---|
| Embodiment 2-1 | 4.7E+03 | 8.26 | 8.65 |
| Embodiment 2-2 | 6.0E+03 | 8.24 | 8.68 |
| Embodiment 2-3 | 2.0E+04 | 8.23 | 8.66 |
| Embodiment 2-4 | 9.0E+04 | 8.25 | 8.68 |
| Embodiment 2-5 | 1.2E+05 | 8.27 | 8.71 |
| Embodiment 2-6 | 1.3E+05 | 8.28 | 8.72 |
| Embodiment 2-7 | 2.0E+05 | 8.31 | 8.76 |

As described above, according to the embodiments of the disclosure, even when short circuit caused by a defect of a substrate itself occurs in an organic light emitting device, a function of the organic light emitting device is normally maintained.

Moreover, according to the embodiments of the disclosure, even when an area size of a portion where short circuit occurs increases, the organic light emitting device stably operates without an increase in the amount of leakage current.

Moreover, in the organic light emitting device according to the embodiments of the disclosure, an intensity of emitted light near an area where short circuit occurs is prevented from being lowered.

It will be apparent to those skilled in the art that various modifications and variations can be made in the disclosure without departing from the spirit or scope of the inventions. Thus, it is intended that the disclosure covers the modifications and variations of this invention provided they come within the scope of the appended claims and their equivalents.

What is claimed is:

1. An organic light emitting device comprising:
    a first electrode;
    an organic material layer including an at least five-layered emission layer provided between the first electrode and a second electrode; and
    a secondary electrode provided on a top, a bottom, or a side surface of the first electrode and electrically connected to the first electrode, the secondary electrode having a mesh structure,
    wherein
    each of meshes of the secondary electrode configures a pixel of the organic light emitting device,
    a sheet resistance of the first electrode is 5,000Ω/□ or more and a sheet resistance of the secondary electrode is 3Ω/□ or less,
    an area of the pixel is 0.01 mm² to 0.64 cm² and an aperture ratio of the secondary electrode is 70% or more,
    a multiplication of the sheet resistance of the first electrode and the area of one of the pixels is 3,200, V cm²/A or less, and
    a multiplication of the sheet resistance of the secondary electrode and a whole pixel area of the organic light emitting device is 960 V cm²/A or less.

2. The organic light emitting device of claim 1, wherein number of pixels may be 1,000 to 1,000,000.

3. The organic light emitting device of claim 1, wherein the first electrode comprises one or more materials selected from a group consisting of Nb-based oxide, Ti-based oxide, Zn-based oxide, and a conductive polymer.

4. The organic light emitting device of claim 1, wherein a luminance difference between one pixel and another pixel is within 30%.

5. The organic light emitting device of claim 1, wherein a luminance difference in a whole emissive area of the organic light emitting device is within 10%.

6. The organic light emitting device of claim 1, wherein a resistance between a first electrode included in one pixel and a first electrode included in another pixel is 2,000Ω to 800,000 Ω.

7. The organic light emitting device of claim 1, wherein the pixel is provided in plurality, and each of the plurality of pixels emits white light of 2,000 K to 12,000 K.

8. The organic light emitting device of claim 1, further comprising:
    a substrate provided on a surface of the first electrode opposite to a surface on which the organic material layer is provided; and
    a light scattering layer provided between the substrate and the first electrode,
    wherein the light scattering layer comprises a planarization layer.

9. The organic light emitting device of claim 1, further comprising:
    a substrate provided on a surface of the first electrode opposite to a surface on which the organic material layer is provided;
    a light scattering layer provided on a surface of the substrate opposite to a surface on which the first electrode is provided.

10. The organic light emitting device of claim 1, wherein the organic light emitting device is a flexible organic light emitting device.

11. An organic light emitting device comprising:

a first electrode;

an organic material layer including at least two layered emission layer provided between the first electrode and a second electrode; and a secondary electrode provided on a top, a bottom, or a side surface of the first electrode and electrically connected to the first electrode, the secondary electrode having a mesh structure, wherein each of meshes of the secondary electrode configures a pixel of the organic light emitting device, the sheet resistance of the first electrode is 5,000Ω/□ or more and a sheet resistance of the secondary electrode is 3Ω/□ or less, an area of the pixel is 0.01 mm$^2$ to 0.64 cm$^2$ and an aperture ratio of the secondary electrode is 70% or more, a multiplication of the sheet resistance of the first electrode and the area of one of the pixels is 1,600 V cm$^2$/A or less, and a multiplication of the sheet resistance of the secondary electrode and a whole pixel area of the organic light emitting device is 480 V cm$^2$/A or less.

12. A lighting device comprising an organic light emitting device, wherein the organic light emitting device including:

a first electrode;

a second electrode provided opposite to the first electrode;

an organic material layer including an at least five-layered emission layer provided between the first electrode and the second electrode; and a secondary electrode provided on a top, a bottom, or a side surface of the first electrode and electrically connected to the first electrode, the secondary electrode having a mesh structure, wherein each of meshes of the secondary electrode configures a pixel of the organic light emitting device, a sheet resistance of the first electrode is 5,000Ω/□ or more, and a sheet resistance of the secondary electrode is 3Ω/□ or less, an area of the pixel is 0.01 mm$^2$ to 0.64 cm$^2$ and an aperture ratio of the secondary electrode is 70% or more, a multiplication of the sheet resistance of the first electrode and the area of one of the pixels is 3,200, V cm$^2$/A or less, and a multiplication of the sheet resistance of the secondary electrode and a whole pixel area of the organic light emitting device is 960 V cm$^2$/A or less.

\* \* \* \* \*